United States Patent [19]
Arkles et al.

[11] Patent Number: 5,853,808
[45] Date of Patent: Dec. 29, 1998

[54] METHOD OF USING SILOXANE POLYMERS

[75] Inventors: Barry C. Arkles; Donald H. Berry, both of Dresher; Lisa Kiernan Figge, Philadelphia, all of Pa.

[73] Assignees: Gelest Inc., Tullytown; University of Pennsylvania, Philadelphia, both of Pa.

[21] Appl. No.: 922,613

[22] Filed: Sep. 3, 1997

Related U.S. Application Data

[62] Division of Ser. No. 527,051, Sep. 12, 1995, abandoned.

[51] Int. Cl.$^6$ ........................................... B05D 3/02
[52] U.S. Cl. .................... 427/377; 427/387; 427/515; 428/447; 528/42; 528/31; 528/39; 528/10
[58] Field of Search ............................ 428/447; 427/377, 427/387, 515; 528/42, 31, 39, 10

[56] References Cited

U.S. PATENT DOCUMENTS

| | | | |
|---|---|---|---|
| 3,615,272 | 10/1971 | Collins et al. | 23/366 |
| 3,666,830 | 5/1972 | Alekna | 528/43 |
| 4,743,474 | 5/1988 | Homan | 427/387 |
| 4,999,397 | 3/1991 | Weiss et al. | 524/755 |
| 5,010,159 | 4/1991 | Bank et al. | 528/23 |
| 5,047,492 | 9/1991 | Weidner et al. | 528/15 |
| 5,290,354 | 3/1994 | Haluska | 106/479 |
| 5,320,868 | 6/1994 | Ballance et al. | 427/228 |
| 5,371,262 | 12/1994 | Arkles | 556/449 |

OTHER PUBLICATIONS

Sommer et al. "Organosilicon Compounds. V$^1$ β–Eliminations Involving Silicon" 1946.

Sommer et al. "Organosilicon Compounds.", Journal of the American Chemical Society, 68, pp. 1083–1085, 1946.

L.H. Sommer et al., "Organosilicon Compounds. V. β–Eliminations Involving Silicon," *J. Amer. Chem. Soc.*, 68, pp. 1083–1085 (1946).

L.H. Sommer et al., "Organo–silicon Compounds. III. α–and β–Chloroalkyl Silanes and the Unusual Reactivity of the Latter," *J. Amer. Chem. Soc.*, 68, pp. 485–487 (1946).

L.H. Sommer et al., "Further Studies of β–Eliminations Involving Silicon," *J. Amer. Chem. Soc.*, 70, pp. 2869–2872 (1948).

*Primary Examiner*—Margaret W. Glass
*Attorney, Agent, or Firm*—Panitch Schwarze Jacobs & Nadel, P.C.

[57] ABSTRACT

Silsesquioxane polymers that are useful for preparing $SiO_2$-rich ceramic coatings are obtained as the polymeric reaction products from the hydrolysis and condensation of organosilanes having a β-substituted alkyl group. A preferred silsesquioxane polymer is the polymeric reaction product obtained from β-chloroethyltrichlorosilane. Coating compositions containing such silsesquioxane polymers dissolved in organic solvent may be applied to a substrate and converted to $SiO_2$-rich ceramic thin layers by evaporating the solvent and heating the coated substrate at moderate temperatures.

20 Claims, No Drawings

METHOD OF USING SILOXANE POLYMERS

CROSS REFERENCE TO RELATED PATENT APPLICATION

This patent application is a division of application Ser. No. 08/527,051, filed Sep. 12, 1995, now abandoned.

FIELD OF THE INVENTION

This invention relates to siloxane, silsesquioxane and modified silsequioxane polymers and their use in coating compositions for preparing $SiO_2$-rich ceramic thin films particularly on electronic substrates.

BACKGROUND OF THE INVENTION

Silicon dioxide ($SiO_2$) thin films are an essential component of microelectronic devices and substrates that are currently in widespread usage. These $SiO_2$-containing thin films are generally created using well-known silanes, e.g., $H_4Si$, silane esters, e.g., tetraethoxysilane (TEOS), or silsesquioxanes, e.g., hydrogen silsesquioxane resins such as described in U.S. Pat. No. 5,290,354 of Haluska and U.S. Pat. No. 5,320,863 of Ballance et al.

Component (e.g., transistor) densities on microelectronic devices have continually increased in recent years, and the current development of ultra large scale integration (ULSI) technology, to implement in excess of 300,000 transistors per chip, places severe constraints on layered $SiO_2$-containing thin films and coating application processes employed. The ULSI requirements for multilevel and submicron interconnections demand defect-free uniform silicon dioxide thin films that are not easily achieved with current coating application methodologies, such as spin-on glass (SOG) and chemical vapor deposition (CVD), using known $SiO_2$-forming resins.

SOG ceramic thin films made from known $SiO_2$-film forming materials typically exhibit voids if gap dimensions are less than 0.15 micron. Water evolution during curing of such SOG coating compositions results in high shrinkage and stressed films. SOG coating compositions using methyltriethoxysilane, instead of the more commonly used tetraethoxysilane (TEOS), require a greater degree of cure before plastic flow characteristics of the resin are overcome, which may adversely affect planarization characteristics.

CVD ceramic thin films made using TEOS can provide submicron interconnections but do not provide satisfactory high gap-fill capacity and reliability, a requirement of ULSI multilevel interconnections. The tendency of TEOS/CVD ceramic thin films to absorb water can lead to decreased reliability from degradation of metal interconnections. CVD ceramic thin films that incorporate boron or phosphorus exhibit improved process parameters but at the cost of sacrificed dielectric properties. CVD thin films derived from known silsesquioxanes, instead of TEOS or other silanes, exhibit reduced dimensional stability, particularly upon thermal cycling required for interlayer application.

Sommer et al., "Organosilicon Compounds V. β-Eliminations Involving Silicon," *J. Amer. Chem. Soc.*, 68, pp. 1083–1085 (1946) summarizes chemical reaction studies of β-chloroethyltrichlorosilane and β-chloro-n-propyltrichlorosilane, including synthesis of β-chloroethyl silicone. The β-chloroethyl silicone polymer, having a formula $ClCH_2CH_2SiO_{1.5}$, was reacted with dilute alkali to give ethylene and $Si(OH)_4$. No end use applications for these compounds were suggested.

SUMMARY OF THE INVENTION

In accordance with the present invention, a silsesquioxane polymer, useful for preparing $SiO_2$-rich films, is the polymeric reaction product that is obtained from the hydrolysis and condensation polymerization of an organosilane containing a β-substituted alkyl group, the organosilane having the general formula $R_nSiX_{(4-n)}$ where n is 1 or 2; X is a halogen selected from the group consisting of chlorine, bromine, fluorine, and iodine, or an alkoxy selected from the group consisting of methoxy, ethoxy and propoxy substituents; and R is an alkyl group having at least one but not more than two β-substituents that are electronegative, and wherein the polymeric reaction product contains silanol groups. The β-substituted alkyl group, R in the general formula, is preferably an ethyl group or propyl group having at least one but not more than two β-substituents selected from the group consisting of chlorine, bromine, fluorine, iodine, methoxy and ethoxy.

The β-substituted organosilsesquioxane polymer of this invention may also contain at least one but not more than two α-substituents on the β-substituted alkyl group, the α-substituent on the β-substituted alkyl group being selected from the group consisting of chlorine, bromine, fluorine, iodine, methoxy and ethoxy. The α-substituent on such a silsesquioxane polymer is preferably the same as the β-substituent on the alkyl group.

A preferred embodiment of this invention is a silsesquioxane polymer, useful for preparing $SiO_2$-rich films, that is the polymeric reaction product obtained from the hydrolysis and condensation polymerization of an organosilane containing a β-substituted ethyl group, the organosilane having the general formula $R_nSiX_{(4-n)}$ where n is 1 (i.e., the general formula becomes $RSiX_3$); X is a halogen selected from the group consisting of chlorine and bromine or an alkoxy selected from the group consisting of methoxy and ethoxy substituents; and R is a β-substituted ethyl group where the β-substituent is mono- or di-substituted and is selected from the group consisting of chlorine, bromine and fluorine and methoxy.

This silsesquioxane polymer may also contain at least one but not more than two α-substituents on the β-substituted ethyl group, the α-substituent being selected from the group consisting of chlorine, bromine, fluorine and methoxy. The α-substituent on such a silsesquioxane polymer is preferably the same as the β-substituent on the ethyl group.

A highly preferred β-substituted organosilsesquioxane polymer of this invention, useful for preparing $SiO_2$-rich films, is the polymeric reaction product that is obtained from the hydrolysis and condensation polymerization of an organosilane containing a β-substituted ethyl group, the organosilane being β-chloroethyltrichlorosilane, $ClCH_2CH_2SiCl_3$.

The β-substituted organosilsesquioxane polymeric reaction products of this invention contain free silanol groups. Such silsesquioxane polymer compositions are preferably polymeric reaction products that contain at least about five up to about 75 silanol groups per 100 silicon atoms and more preferably that contain about 20 to about 50 silanol groups per 100 silicon atoms.

The silsesquioxane polymer of this invention is preferably a polymeric reaction product that is obtained from homopolymerization of the organosilane. In alternative embodiments, the β-substituted organosilsesquioxane polymer may be a polymeric reaction product that is obtained from copolymerization of the organosilane with an alkoxysilane, e.g., a tetraalkoxysilane or organic substituted alkoxysilane. The alkoxysilane is preferably selected from the group consisting of tetraalkoxysilanes such as tetraethoxysilane (TEOS), tetramethoxysilane (TMOS), methoxytriethoxysilane, triethoxychlorosilane, and organic substituted alkoxysilanes such as bis(β-chloroethyl) dichlorosilane, bis(trimethoxysilyl)ethane, methyltriethoxysilane, vinyltriethoxysilane, pentafluorophenyltriethoxysilane, tridecafluorooctyl-1H, 2H,2H-octyltriethoxysilane and phenyltrimethoxysilane.

The silsesquioxane polymer may also be a polymeric reaction product that is obtained from copolymerization of the organosilane with a hydride functional silane, preferably trichlorosilane, $HSiCl_3$, or triethoxysilane.

The present invention also includes the method of forming $SiO_2$-rich ceramic thin films on a substrate by applying a coating composition containing the silsesquioxane polymer of this invention onto a substrate and processing the coated substrate in an atmosphere containing at least 0.5% relative humidity under conditions sufficient to convert the silsesquioxane polymer into a $SiO_2$-rich ceramic thin film. The relative humidity is preferably in the range of about 15% to about 100%. When treated by thermal processing to convert the silsesquioxane polymer into a ceramic thin film, the coated substrate is preferably heated to a temperature of about 150° C. to about 700° C. to effect this conversion. The coated substrate may alternatively be processed by exposure to UV irradiation, to convert the silsesquioxane polymer into a ceramic thin film.

The coating composition containing the silsesquioxane polymer is preferably a homogeneous liquid that includes an organic solvent for dissolving the silsesquioxane polymer, the solvent being selected from the group consisting of aromatic hydrocarbons and their epoxy-functional derivatives, glycol ethers, alkanes and their epoxy-functional derivatives, ketones, esters and orthoesters, chlorinated hydrocarbons, chlorinated hydrocarbons, chlorofluorocarbons and alcohols.

DETAILED DESCRIPTION OF THE PREFERRED EMBODIMENTS

The siloxane polymers of this invention are useful for applying thin films or layers of silicon dioxide to substrates, particularly $SiO_2$-containing ceramic thin films that are applied to electronic substrates. These siloxane polymers are silsesquioxane polymers containing β-substituted organic groups which serve as electron-withdrawing substituents, a characteristic that facilitates their subsequent conversion into $SiO_2$-rich uniform, crack-free thin films.

The silsesquioxane polymers are obtainable from the hydrolysis and condensation polymerization of specific silane monomers, containing β-substituted organic groups, in particular, β-substituted alkyl groups. The β-substituted alkyl groups are also present in the silsesquioxane polymers of this invention.

The β-substituents on the alkyl groups in this invention are those containing a substituent that is electronegative, in the β or 2 carbon position of the alkyl group, relative to the organic group's attachment to silicon. A preferred β-substituted alkyl group employed in this invention is chlorine on an ethyl group, namely, the preferred β-chloroethyl group, but other β-substituents that are strongly electron-withdrawing are also suitable.

The β-substituted alkyl groups utilized in this invention are labile but are also hydrolytically stable, which permits preparation of the β-substituted organosilsesquioxane polymers under typically aqueous conditions, e.g., in aqueous media. The β-substituted alkyl groups appear to limit $SiO_2$ matrix formation during preparation of the β-substituted organosilsesquioxane polymeric reaction product. The recovered β-substituted organosilsesquioxane polymer may subsequently be converted, by heating of the polymer, to a $SiO_2$-rich ceramic material, preferably as a thin film ceramic coating on a substrate.

Upon such subsequent heating of the β-substituted organosilsesquioxane polymers at relatively moderate temperature conditions, the labile β-substituted alkyl groups appear to be volatilized and substantially eliminated from the $SiO_2$-rich ceramic material that forms during this process. These aspects of the present invention are discussed in more detail further below.

The β-substituted organosilsesquioxane polymers of this invention may be obtained from the hydrolysis and condensation polymerization reaction of any of a variety of organosilanes containing at least one β-substituted alkyl group, where the β-substituent is electronegative and strongly electron-withdrawing.

These organosilanes may be characterized as having the general formula $R_nSiX_{(4-n)}$ where n is 1 or 2, with n preferably being 1. In the general formula, X represents a halogen selected from chlorine, bromine, fluorine, iodine, or an alkoxy group selected from methoxy ($-OCH_3$), ethoxy ($-OCH_2CH_3$), and propoxy ($-OCH_2CH_2CH_3$, $-OCH(CH_3)_2$) substituents. Preferably, X in the general formula is chlorine, bromine, methoxy or ethoxy. In the general formula, R represents the β-substituted alkyl group that is a β-substituted ethyl or propyl group or other equivalent β-substituted alkyl group, where the β-substituent is selected from chlorine, bromine, fluorine, iodine, methoxy ($-OCH_3$) and ethoxy ($-OCH_2CH_3$). The β-substituted alkyl group is preferably a β-substituted ethyl group. The β-substituent may be present on the alkyl group as a single β-substituent or as two β-substituents. In the latter case, the β-substituents may be the same or different, although preferably the substituents are the same.

The β-substituent is located on the β-carbon of the alkyl group, sometimes referred to as the 2-carbon position, located with respect to the silicon bond. The β-substituted alkyl group is bound to the silicon at the α- or 1-carbon position.

The β-substituted organosilanes defined by the general formula noted above may also contain substituents bound to the ethyl or propyl or other equivalent alkyl group at the α-carbon position. The α-substituents are selected from the same group as that for the β-substituents, as described above. The α-substituents may be present on the β-substituted alkyl group as a single α-substituent or as two α-substituents, and in the latter case the substituents are preferably the same. The α- and β-substituents may be the same or different, although preferably all substituents are identical.

For organosilanes containing β-substituted propyl groups, the γ-carbon (or 3-carbon) position may also contain one or two γ-substituents selected from the same group as that noted above for the β-substituents. The γ-substituents may be the same or different if two γ-substituents are present, and the γ-substituent(s) may also be the same as or different from the other substituents on the propyl group.

Among the preferred organosilanes are those containing a single β-substituted ethyl group containing chlorine, bromine, fluorine or methoxy substituents. Preferred organosilanes are β-substituted ethyltrichlorosilanes, β-substituted ethyltriethoxysilanes and β-substituted ethyl trimethoxysilanes. A highly preferred organosilane is β-chloroethyltrichlorosilane, $ClCH_2CH_2SiCl_3$.

As noted above, the β-substituted alkyl groups such as the preferred β-substituted ethyl groups in the organosilane monomers used to prepare the β-substituted organosilsesquioxane polymers of this invention, limit the degree of crosslinking in the silicon oxygen network during hydrolysis. This characteristic of the β-substituted organosilsesquioxane polymers facilitates their subsequent use in the preparation of $SiO_2$-rich ceramic thin films, particularly on electronic substrates.

When the β-substituted organosilsesquioxane polymers are reacted further, either by heating at moderate temperatures, e.g., above about 150° C., or by exposure to ultraviolet radiation, the labile β-substituted alkyl groups are substantially volatilized and the silsesquioxane polymer is converted to a $SiO_2$-rich ceramic material, suitable for preparing thin films or layers on electronic substrates.

The silsesquioxane polymers of this invention, obtainable from the hydrolysis and condensation polymerization reaction of β-substituted organosilanes, contain free silanol groups (Si—OH), i.e., unreacted or non-condensed silanol groups. Preferred silsesquioxane polymers contain at least about five silanol groups per 100 silicon atoms, up to about 75 silanol groups per 100 silicon atoms, in the polymeric reaction product. More preferably, the silsesquioxane polymers contain about 20 to about 50 silanol groups per 100 silicon atoms in the polymeric reaction product.

The free silanol content in the polymeric reaction product is initially high, and this can be maintained by neutralizing the reaction mixture and recovering the polymeric reaction product. In the presence of a catalyst, typically an acid, condensation of the free silanol groups proceeds with the generation of water as a byproduct. Polymeric reaction products with low levels of free silanol groups can be prepared, for example, by refluxing the polymer reaction product in an organic solvent, e.g., benzene, in the presence of an acid catalyst and collecting byproduct water, e.g., in a Dean-Stark trap. Such polymerized reaction products, with lower levels of free silanol, exhibit more extensive crosslinking that results from the reaction of the free silanol groups originally present.

The β-substituted organosilsesquioxane polymers of this invention are preferably the homopolymerization reaction products of the organosilanes described above.

The present invention, however, also extends to copolymerizations of the β-substituted organosilanes with other silanes such as tetraalkoxysilanes, organic substituted alkoxysilanes or halosilanes. Copolymerization of the selected β-substituted organosilane with alkoxysilanes such as tetraethoxysilane (TEOS), tetramethoxysilane (TMOS), methoxytriethoxysilane, triethoxychlorosilane, bis(β-chloroethyl)dichlorosilane, bis(trimethoxysilyl)ethane and the like serves to reduce or lower the organic content of the resultant copolymeric reaction product.

On the other hand, copolymerization of the β-substituted organosilane with organoalkoxysilanes such as methyltriethoxysilane, vinyltriethoxysilane, pentafluorophenyltriethoxysilane, tridecafluorooctyl-1H,2H,2H-octyltriethoxysilane, phenyltrimethoxysilane and the like serves to increase the organic content of the resultant copolymeric reaction product.

The silsesquioxane polymers of this invention also include copolymerization reaction products with a hydride- or organo-functional silane such as trichlorosilane or ethyltrichlorosilane. Preferred trichlorosilanes include trichlorosilane, $HSiCl_3$ and triethoxysilane, $HSi(OC_2H_5)_3$, and organotrichlorosilanes like ethyltrichlorosilane, methyltrichlorosilane and phenyltrichlorosilane.

The silsesquioxane polymers are obtained by the hydrolysis and condensation of the β-substituted organosilane, either in the homopolymerization of the organosilane monomer or its copolymerization as described above. The hydrolysis and condensation polymerization reactions are exothermic and may be controlled via factors that are typically important in such hydrolysis and condensation reactions, and some of these are described below.

The hydrolysis and condensation polymerization may be carried out in conventional equipment, by the addition of the organosilane monomer (or both monomers in the case of copolymerization) to an aqueous medium. The aqueous medium may be simply water or may be an aqueous alcohol. The monomer may be added neat or may be first solubilized in a solvent, e.g., methylene chloride. The monomer is preferably added at a measured rate, e.g., slowly, to the aqueous medium to obtain more precise control of the hydrolysis and condensation.

Additional control of the hydrolysis and condensation polymerization reactions may also be obtained though adjustment of the temperature of the aqueous reaction medium, by maintaining the reaction temperature in the range of about 0° C. to about 50° C. Preferably, the temperature of the aqueous reaction medium is maintained at a temperature around (but above) the freezing point of the aqueous medium, about 0° C. to about 5° C. being preferred.

At the preferred reaction temperatures, the hydrolysis and condensation reactions occur more slowly. This permits, for example, the level of silanol content in the polymeric reaction product to be adjusted with greater control and precision.

Recovery of the polymeric reaction product, i.e., the β-substituted organosilsesquioxane polymers, from the aqueous reaction medium may be carried out using conventional techniques, e.g., solvent extraction (with organic solvents that solubilize the polymeric reaction product but are immiscible with the aqueous reaction medium), salting-out of the polymeric reaction product, and the like. The polymeric reaction product may then be recovered as a substantially pure material (i.e., polymer) in solid form, by filtration or evaporation of the extract solvent as applicable. Alternatively, the selection of extraction solvent could be made such that the solvent is also appropriate as a coating solvent, for applying the polymeric reaction product in a solvent-based coating composition to form a $SiO_2$-rich ceramic thin film on a substrate.

The β-substituted organosilsesquioxane polymers of this invention are particularly useful for applying $SiO_2$-rich ceramic thin films to various substrates. These ceramic thin films are particularly valuable on electronic substrates, e.g., electronic devices or circuits.

Such ceramic thin films could serve, for example, as protective films, interlevel dielectric layers, doped dielectric layers to produce transistor-like devices, pigment-loaded binder systems containing silicon to produce capacitor and capacitor-like devices, multilayer devices, 3-D devices, silicon on insulator devices, coatings for superconductors, superlattice devices and the like.

The term "$SiO_2$-rich ceramic thin film" is used in this disclosure to describe the hard Si—O-containing films or layers obtained after heating the β-substituted organosilsesquioxane polymers of this invention. In addition to the silica ($SiO_2$), these thin films or layers may contain other silica-like materials, e.g., SiO, $Si_2O_3$, and silanol (Si—OH), and residual vinyl groups or other forms of residual carbon, as well as any dopants or other components added to the coating composition.

These $SiO_2$-rich thin films are characterized further by being uniform and crack-free when viewed by electron microscopy. Thicknesses of such thin films may range from about 200 Å (angstroms) to about 5000 Å, but greater film thicknesses are possible where end use applications warrant such thicker films. Multiple coating applications of layered thin films are preferred for preparing ceramic films that are 4000 Å or more in thickness, to minimize stress cracking.

The silsesquioxane polymers of this invention may be coated onto the desired substrate by any practical means, but a preferred approach uses a solution comprising the silsesquioxane polymer in a suitable solvent.

For the preferred solution coating method, the solution is generally formed by simply dissolving or suspending the silsesquioxane polymer in a solvent or mixture of solvents. The solvents which may be used in this method are preferably moderately polar solvents, which may include organic solvents selected from the group consisting of aromatic hydrocarbons and their epoxy-functional derivatives, glycol ethers, alkanes and their epoxy-functional derivatives, ketones, esters such as monomethylether acetate, orthoesters, chlorinated hydrocarbons, chlorofluorocarbons and alcohols. Exemplary organic solvents include diglyme (diethylene glycol dimethyl ether), dimethoxyethane, methoxyethylacetate, toluene, and alcohols such as ethanol, methoxypropanol, propoxypropanol and propylene glycol.

Halogen-gettering solvents are especially useful as coating solvents and these include orthoesters such as trimethylacetate and epoxy-functional solvents such as epoxybutane. Halogen-gettering solvents are believed to be useful in the coating compositions and method of this invention for their ability to react with byproduct hydrogen chloride or to react with intermediate Si—Cl-containing species and thus moderate the speed of reaction and eliminate corrosive byproducts.

The coating composition, a homogeneous liquid containing the silsesquioxane polymer in an organic solvent, is then applied to the substrate. Coating means such as spin, spray, dip or flow coating may be utilized. For application to electronic substrates, the coating composition may be applied by the conventional spin-on glass (SOG) techniques, for example.

Following application of the coating composition to the substrate, the coating solvent is allowed to evaporate by means such as simple air drying, by exposure to an ambient environment or by the application of a vacuum or mild heat.

Although the above-described methods primarily focus on using a solution approach, one skilled in the art would recognize in view of this disclosure that other equivalent means of coating (e.g., melt coating) would also function herein and are contemplated to be within the scope of this invention.

The formation of a $SiO_2$-rich ceramic thin film is effected by processing the coated substrate, via treatment at moderately elevated temperatures or with UV irradiation, to convert the silsesquioxane polymer composition into a $SiO_2$-rich ceramic thin film. This crosslinking conversion is carried out in a moisture-containing atmosphere containing at least about 0.5% relative humidity and preferably containing from about 15% relative humidity to about 100% relative humidity. The specified level of moisture may be present in the atmosphere during the entire processing procedure for forming the ceramic thin film or, alternatively, can be present during only a portion of the procedure. It should be noted that high levels of silanol groups (Si—OH) typically present in the silsesquioxane polymer also appear to facilitate the crosslinking reaction that occurs during the conversion procedure and may reduce the level of relative humidity required for efficient conversion of the silsesquioxane polymer into a $SiO_2$-rich ceramic thin film.

The other components in the moisture-containing atmosphere are not critical, and inert gases such as nitrogen, argon, helium or the like may be present or reactive gases such as air, oxygen, hydrogen chloride, ammonia and the like may be present.

In one embodiment of this invention, the conversion of the silsesquioxane polymer on the coated substrate is accomplished via thermal processing, by heating the coated substrate. The temperature employed during the heating to form the ceramic thin film is moderate, preferably being at least about 100° C., more preferably at least about 150° C. Extremely high temperatures, which are often deleterious to other materials present on the substrate, e.g., particularly metallized electronic substrates, are unnecessary. Heating temperatures in the range of about 150° C. to about 700° C. are preferable, with temperatures in the range of about 200° C. to about 500° C. being more preferred. The exact temperature will depend on factors such as the particular β-substituted organosilsesquioxane polymer utilized, the composition of the atmosphere (including relative humidity), heating time, coating thickness and coating composition components.

Heating is generally conducted for a time sufficient to form the desired $SiO_2$-rich ceramic thin film. The heating period typically is in the range of up to about 6 hours. Heating times of less than about 2 hours, e.g., about 0.1 to about 2 hours, are preferred.

The heating procedure is generally conducted at ambient pressure, i.e., atmospheric pressure, but subatmospheric pressure or a partial vacuum or superatmospheric pressures may also be employed. Any method of heating such as the use of a convection oven, rapid thermal processing, hot plate, or radiant or microwave energy is generally functional. The rate of heating, moreover, is also not critical, but it is most practical and preferred to heat as rapidly as possible.

In an alternative embodiment of this invention, the formation of a $SiO_2$-rich ceramic thin film is accomplished by subjecting the coated substrate to ultraviolet (UV) irradiation. Exposure of the coated substrate to light at UV wavelengths has been found to effect the desired crosslinking conversion of the silsesquioxane polymer in the coated substrate. The UV irradiation treatment is ordinarily carried out without subjecting the coated substrate to the elevated temperatures used in the thermal processing, but combinations of the UV irradiation and thermal processing treatments could be employed, if desired.

The $SiO_2$-rich ceramic thin films formed using UV light processing are generally characterized by having higher $SiO_2$ contents than typically result from thermal processing under otherwise identical coating conditions. An advantage of the use of UV processing is that patterned films may be generated on a substrate, by the selective focusing of the UV irradiation.

While not wishing to be bound by a specific mechanism or theory, the inventors speculate that the β-substituted organosilsesquioxane polymers of this invention are converted to a $SiO_2$-rich ceramic coating as follows. Upon being heated to moderate temperatures, typically above 150° C., or upon being subjected to UV irradiation, the β-substituted organosilsesquioxane polymer undergoes elimination of an olefin, apparently from the labile β-substituted alkyl groups in the polymer. For the preferred polymers where the β-substituted organic group is β-chloroethyl, the olefin eliminated is ethylene. If the β-substituted organic group were 1,2-dichloroethyl, then vinyl chloride would be eliminated. If the β-substituted organic group were β-chloropropyl, then propylene would be eliminated.

The volatilization of the ethylene during thermal or UV processing of the preferred β-substituted β-chloroethylsilsesquioxane polymers of this invention results in the formation of intermediate Si—Cl groups that are useful in promoting additional crosslinking within the polymer. The resulting Si—Cl bonds undergo rapid hydrolysis and condensation to yield a $SiO_2$-rich ceramic matrix.

In situations where virtually all silicon atoms of the polymer contain organic groups with the preferred β-chloroethyl β-substituent, most of the organic content of the silsesquioxane polymer is volatilized as ethylene upon heating (or upon being UV irradiated), but a minor portion (e.g., 25% or less) of the organic groups undergo elimination, with formation of HCl for such β-substituted chloroethyl groups, to form a vinyl group in the resulting $SiO_2$-rich ceramic material. It is believed that this small portion of vinyl groups is thermally stable under typical fabrication and operating conditions employed with microelectronic circuitry, although some of the vinyl groups may behave as organic crosslinking sites in the $SiO_2$-rich ceramic thin film.

The Si—O—Si crosslinking bonds that result during thermal or UV processing of the silsesquioxane polymer to form a $SiO_2$-rich ceramic coating are believed to be facilitated by the presence of free silanol groups (Si—OH), which are preferably present in the polymer. These Si—OH silanol groups appear to undergo a crosslinking reaction with the intermediate Si—Cl groups, formed in the processed polymer during volatilization of ethylene, with the concurrent evolution of HCl as a crosslinking reaction byproduct.

The β-substituted organosilsesquioxanes in this disclosure may be converted into uniform, crack-free $SiO_2$-rich thin films at relatively moderate temperatures or via UV treatment, and this characteristic makes these polymers especially useful in microelectronic applications where the substrate has been metallized with high temperature-sensitive materials, e.g., aluminum.

Ceramic thin films with desirable physical properties can also be prepared using copolymers of the β-substituted organosilanes copolymerized with other silane monomers, such as described above and in the Examples which follow. Representative copolymers are those prepared from β-chloroethyltrichlorosilane and methyltriethoxysilane. Ceramic thin films on electronic substrates made with such copolymers typically exhibit good dielectric properties but lower capacitance, the latter being advantageous in some microcircuit designs since it eliminates cross-talk.

The present invention is illustrated further by the following non-limiting Examples.

EXAMPLE 1

Preparation of 2-Chloroethylsilsesquioxane

β-chloroethyltrichlorosilane ($ClCH_2CH_2SiCl_3$) in an amount of 25.0 g (0.126 mol) was added dropwise with stirring to 250 mL distilled water at a temperature of 0° C. Upon completion of the addition of the β-chloroethyltrichlorosilane, an organic solvent, dichloromethane in an amount of 200 mL, was added to the aqueous reaction medium and stirred for ten minutes, in order to extract the polymeric reaction product from the aqueous medium. The reaction mixture was then filtered to remove a small amount of precipitate that formed, and the organic phase containing dichloromethane and extracted reaction product was next separated from the aqueous phase and retained. The aqueous phase was then extracted further with three washings of dichloromethane, in an amount of 100 mL each. The dichloromethane washings were combined with the original organic phase extract, and the combined organic phase solution was dried by stirring over sodium sulfate for one hour and thereafter filtered. After evaporation of the solvent from the organic phase extract, the polymeric reaction product that was recovered was dried overnight under high vacuum to yield a clear resin, in an amount of 10.65 g (a recovery of 73% of total theoretical yield) of 2-chloroethylsilsesquioxane polymer. A small amount of unidentified precipitate, 0.3 g in amount, was also isolated from the reaction mixture as noted above. The polymeric reaction product was determined to have a number average molecular weight (Mn) of 750–1250 and a weight average molecular weight (Mw) of 1200–1600, both determined by GPC relative to a polystyrene standard calibration. An NMR analysis indicated an approximate ratio of 1 hydroxyl group for every three silicon atoms.

EXAMPLE 2

Preparation of 2-Bromoethylsilsesquioxane

β-bromoethyltrichlorosilane ($BrCH_2CH_2SiCl_3$) in an amount of 18.24 g (0.075 mol) was added dropwise with stirring to 250 mL of distilled water at a temperature of 0° C. Dichloromethane in an amount of 200 mL was then added to the aqueous reaction medium to extract the polymeric reaction product from the aqueous medium, and the reaction mixture was stirred for ten minutes. The reaction mixture was then filtered to remove a small amount of precipitate that formed, and the organic phase containing dichloromethane and extracted reaction product was next separated from the aqueous phase and retained. The aqueous phase was extracted further with additional washings of dichloromethane, three volumes of 100 mL each. The dichloromethane washings were combined with the original organic phase extract, and the combined organic phase solution was dried by stirring over sodium sulfate for one hour and then filtered. After evaporation of the solvent from the organic phase extract, the polymeric reaction product that was recovered was dried overnight under high vacuum to yield a clear resin, in an amount of 7.03 g (58.4% of theoretical yield) of 2-bromoethylsilsesquioxane polymer. A small amount of unidentified precipitate, 0.30 g, was also isolated from the reaction mixture as noted above. Additional clear resin, in an amount of 2.1 g (17.4% of theoretical yield), was recovered from the dichloromethane-washed aqueous phase by salting out, by saturating the aqueous phase with sodium chloride. Total solids that were recovered were 78.3% of theoretical yield. The polymeric reaction product was determined (as in Example 1) to have a Mn of 1000–1400 and a Mw of 2600–3500.

EXAMPLE 3

Preparation of 1,2-Dichloroethylsilsesquioxane

α, β-dichloroethyltrichlorosilane ($ClCH_2CHClSiCl_3$) in an amount of 18.4 g (0.079 mol) was added dropwise with stirring to 250 mL distilled water at a temperature of 0° C. Dichloromethane in an amount of 200 mL was added to the aqueous reaction medium, and the reaction mixture was stirred for ten minutes, but this procedure was unsuccessful in extracting the polymeric reaction product from the aqueous phase. Only after the aqueous phase had first been saturated with sodium chloride was it possible to recover the polymeric reaction product from the reaction mixture by dichloromethane extraction. Following the initial dichloromethane extraction, the NaCl-saturated aqueous phase was then washed with three 100 Ml volumes of dichloromethane. The dichloromethane washings were combined with the original organic phase extract, and the combined organic phase solution was dried by stirring over sodium sulfate for one hour and thereafter filtered. After evaporation of the solvent from the organic phase extract, the polymeric reaction product that was recovered was dried overnight under high vacuum to yield a clear resin, in an amount of 3.08 g (26% of total theoretical yield) of 1,2-dichloroethylsilsesquioxane polymer. The polymeric reaction product was determined (as in Example 1) to have a Mn of 300–400 and a Mw of 550–700.

EXAMPLE 4

Preparation of 2-Chloroethylsilsesquioxane TEOS Copolymer

An organic solution containing β-chloroethyltrichlorosilane ($ClCH_2CH_2SiCl_3$) and tetraethoxysilane ($Si(OCH_2CH_3)_4$) was first prepared by adding 20.0 g (0.101 mol) of β-chloroethyltrichlorosilane and 1.05 g (0.005 mol) of tetraethoxysilane (TEOS) in 100 mL methylene chloride. This solution was added dropwise with stirring to 200 mL distilled water at a temperature of 0° C. Dichloromethane in an amount of 250 mL was next added to the reaction medium to extract the polymeric reaction product from the aqueous reaction medium, and the reaction mixture was stirred for ten minutes. The reaction mixture was then filtered, and the organic phase containing dichloromethane and extracted reaction product was separated from the aqueous phase and retained. The aqueous phase was next washed with three volumes of dichloromethane, 100 mL each, and these washings were combined with the original organic phase extract recovered from the reaction mixture. The combined organic phase solution was dried by stirring over sodium sulfate for one hour and thereafter filtered. After evaporation of the dichloromethane solvent from the organic phase solution, the polymeric reaction product that was recovered was dried overnight under high vacuum to yield a clear resin, in an amount of 9.43 g (about 75% of total theoretical yield) of 2-chloroethylsilsesquioxane TEOS copolymer resin. The polymeric reaction product was determined (as in Example 1) to have a Mn of 1580 and a Mw of 2580.

EXAMPLE 5

Preparation of 2-Chloroethylsilsesquioxane Hydridosilsesquioxane Copolymer

β-chloroethyltrichlorosilane ($ClCH_2CH_2SiCl_3$) in an amount of 22.2 g (0.110 mol) and trichlorosilane ($HSiCl_3$) in an amount of 5.08 g (0.037 mol) were combined, and the combined components were added dropwise with stirring to 250 mL distilled water at a temperature of 0° C. Dichloromethane in an amount of 250 mL was then added to the aqueous reaction medium to extract the polymeric reaction product from the aqueous medium, and the reaction mixture was stirred for ten minutes. The reaction mixture was then filtered to remove a small amount of precipitate that formed, and the organic phase containing dichloromethane and extracted reaction product was then separated from the aqueous phase and retained. The aqueous phase was extracted further with additional washings of dichloromethane, three volumes of 100 mL each. These dichloromethane washings were combined with the original organic phase extract, and the combined organic phase solution was dried by stirring over sodium sulfate for one hour and then filtered. After evaporation of the dichloromethane solvent from the organic phase extract, the polymeric reaction product that was recovered was dried overnight under high vacuum to yield a clear copolymer resin, in an amount of 6.64 g of 2-chloroethylsilsesquioxane hydridosilsesquioxane copolymer. A solid precipitate was also collected from the reaction mixture, as noted earlier, in an amount of 4.83 g to give a total recovered solids yield of 77% of theoretical yield. The polymeric reaction product was determined (as in Example 1) to have a Mn of 700–850 and a Mw of 1450–1600.

EXAMPLE 6

Preparation of Methyl 2-Chloroethylsiloxane

β-chloroethylmethyldichlorosilane (($ClCH_2CH_2)(CH_3)SiCl_2$) in an amount of 25.0 g (0.141 mol) contained in 100 mL dichloromethane was added dropwise with stirring to 225 mL distilled water at a temperature of 0° C. Upon completion of the addition of the β-chloroethylmethyldichlorosilane, the aqueous reaction medium was stirred for ten minutes, and the organic phase containing dichloromethane and polymeric reaction product was then separated from the aqueous phase and retained. The aqueous phase was then extracted further with three washings of dichloromethane, in an amount of 50 mL each. The dichloromethane washings were combined with the original organic phase extract, and the combined organic phase solution was dried by stirring over sodium sulfate for one hour and thereafter filtered. After evaporation of the solvent from the organic phase extract, the polymeric reaction product that was recovered was dried overnight under high vacuum to yield a clear resin, in an amount of 15.01 g (a recovery of 86% of total theoretical yield) of methyl 2-chloroethylsiloxane polymer. The polymeric reaction product was determined (as in Example 1) to have a Mn of 650–750 and a Mw of 1250–1450. The polymeric reaction product of this Example is a substantially linear siloxane polymer that may be converted to a modified methylsilsesquioxane.

EXAMPLE 7

Preparation of Trimethylsiloxy-terminated Poly(2-chloroethyl)methylsiloxane

The polymeric reaction product from Example 6, in an amount of 10.04 g, was solubilized in 10 mL benzene and was refluxed, in the presence of 0.5 g Amberlyst® 15 ion exchange resin, for about 3–4 hours at a temperature of about 80°–85° C. before being cooled. The refluxing was carried out with a Dean-Stark trap connected to the condenser, and 0.24 g $H_2O$ was collected in the trap, which was removed after this reflux period. Hexamethyldisiloxane, in an amount of 0.812 g (0.005 mol), and an additional 0.5 g Amberlyst® 15 resin were then added to the cooled solution containing the polymeric reaction product. Refluxing was again continued, for an additional three hours, before the solution was cooled and filtered. After evaporation of the organic solvent, the polymeric reaction product that was recovered was dried overnight at high vacuum to yield a clear resin, in an amount of 10.94 g of trimethylsiloxy-capped poly(2-chloroethyl)methylsiloxane polymer. The polymeric reaction product was determined (as in Example 1) to have a Mn of 1650–1700 and a Mw of 2500–2700. The polymeric reaction product of this Example is a substantially linear siloxane polymer that may be converted to a modified methylsilsesquioxane by heating.

EXAMPLE 8

Sol-Gel Preparation of 2-Chloroethylsilsesquioxane

Water, in an amount of 1.17 g (0.065 mol) was added dropwise to a solution containing 4.0 g (0.0216 mol) of β-chloroethyltrimethoxysilane ($ClCH_2CH_2Si(OCH_3)_3$) in 2.07 g (0.065 mol). Next, four drops of 0.01M HCl were added. The reaction mixture immediately began to thicken and was allowed to evaporate over a period of four days. The polymeric reaction product, 2-chloroethylsilsesquioxane, was a dense, clear, hard resin that was slightly soluble in tetrahydrofuran solvent. The polymer reaction product was determined (as in Example 1) to have a Mn of about 4500–4700 and a Mw of about 9000–11,000. The technique described in this Example allows the formation of thicker $SiO_2$-rich films with lower density which are of potential utility in low dielectric constant applications.

COMPARATIVE EXAMPLE

Preparation of Chloromethylsilsesquioxane

A silane lacking a β-substituted alkyl group was employed in this comparative Example, which was otherwise analogous to the procedure described for Example 1. Chloromethyltrichlorosilane ($ClCH_2SiCl_3$) in an amount of 10.0 g (0.054 mol) was added dropwise with stirring to 100 mL distilled water at a temperature of 0° C. Dichloromethane in an amount of 100 mL was added to the aqueous reaction medium to extract the reaction product that formed in the aqueous medium, and the reaction mixture was stirred for ten minutes. The reaction mixture was then filtered, and the organic phase containing dichloromethane and reaction product was separated from the aqueous phase and retained. The aqueous phase was then extracted with additional volumes of dichloromethane, three volumes of 50 mL each, and these washings were combined with the original organic phase extract recovered from the reaction mixture. The combined organic phase solution was dried by stirring over sodium sulfate for one hour and then filtered. After evaporation of the dichloromethane solvent from the organic phase extract, the reaction product that was recovered was dried overnight under high vacuum to yield 1.37 g (25% of total theoretical yield) of chloromethylsilsesquioxane, as a fine white powder. The recovered reaction product, after drying, was found to be no longer soluble in dichloromethane, and this was attributable to the significant increase in molecular weight of the reaction product that occurred from condensation of silanol groups during drying.

Thermal treatment of the chloromethylsilsesquioxane reaction product does not result in crosslinking and elimination of a labile olefin. Conversion of chloromethylsilsesquioxane to a $SiO_2$-containing coating requires high temperatures, in excess of 450° C. which is not acceptable for many microelectronic processing applications.

EXAMPLE 9

Use of 2-Chloroethylsilsesquioxane Polymeric Reaction Product in Coating a Silicon Substrate A coating solution was prepared in this Example by dissolving β-chloroethylsilsesquioxane, substantially identical to the polymeric reaction product prepared in Example 1, in an organic solvent, diglyme (diethylene glycol dimethyl ether), to yield a concentration of 15 wt. % β-chloroethylsilsesquioxane in the solvent. The coating solution was applied by conventional spin casting techniques onto three-inch silicon wafers, by spinning at 2000 rpm to yield a coating film of 2000 angstroms (Å) in thickness.

Two alternative methods were used to form $SiO_2$-rich thin film coatings on the coated silicon wafers.

In a thermal processing method, the coated wafers were heated to a temperature of 450° C., in air containing greater than 10% relative humidity for four hours. After this thermal processing treatment, the silicon wafers contained a $SiO_2$-rich ceramic layer in a uniform featureless film that was 1100 Å thick. The resulting ceramic thin film, when analyzed by RBS (Rutherford backscattering spectroscopy) measurements, contained 30% Si, 50% O, 8% C, 6% H and less than 1% Cl (atom basis). X-ray reflectivity studies of the ceramic coating indicated that the film was amorphous and had 85% of density of thermally silicon dioxide. Scanning electron microscopy showed the coating to be uniform and crack free.

In the second method, the coated silicon wafers described above were not subjected to thermal processing, but were instead exposed to ultraviolet light at a wavelength of 193 nm, for a period of 30 minutes. After this UV irradiation treatment, the silicon wafers contained a $SiO_2$-rich ceramic layer in a film that was comparable to the ceramic thin films obtained from thermal processing, except that the UV-treated films exhibited a much higher $SiO_2$ content. RBS measurements indicated that the ceramic layer was essentially pure $SiO_2$ with less than 1% contamination from chlorine or carbon.

The procedure of this Example was repeated using coating solutions containing β-chloroethylsilsesquioxane in diglyme solvent at two additional, different concentrations and in methoxypropanol solvent. The coated silicon wafers in each of these procedures were subjected to the thermal processing treatment described above.

When the polymeric reaction product was present in diglyme at a concentration of 20% by weight (instead of 15% by weight used previously), the resultant $SiO_2$-rich ceramic layer was a film that was 2000 Å in thickness (instead of 1100 Å as previously). When the polymeric reaction product was present in diglyme at a 50% by weight concentration, the resultant ceramic layer was 4100 Å in thickness.

When methoxypropanol solvent was substituted for diglyme and the polymeric reaction product was present in the solvent at a concentration of 20% by weight, the resultant ceramic layer was a film that was 3000 Å in thickness, a much thicker film than was obtained with diglyme solvent at an equivalent solids concentration.

The ceramic layers that were films thinner than 4000 Å were uniform, featureless films with no indications of stress cracking. For single coat films thicker than 4000 Å, signs of stress cracking were evident.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method of forming a SiO$_2$-containing ceramic film on a substrate comprising applying a coating containing a siloxane polymer onto a substrate and processing the coated substrate in an atmosphere containing at least 0.5% relative humidity under conditions sufficient to convert the siloxane polymer into a SiO$_2$-containing ceramic film, wherein the siloxane polymer comprises a polymeric reaction product containing at least about five up to about 75 silanol groups per 100 silicon atoms and obtained from the hydrolysis and condensation polymerization of an organosilane containing a β-substituted alkyl group, the organosilane having the general formula:

$$R_nSiX_{(4-n)}$$

where n is 1 or 2; X is a halogen selected from the group consisting of chlorine, bromine, fluorine, and iodine, or an alkoxy selected from the group consisting of methoxy, ethoxy and propoxy substituents; and R is an alkyl group having at least one but not more than two β-substituents that are electronegative.

2. The method of claim 1 wherein the relative humidity is in the range of about 15% to about 100%.

3. The method of claim 1 wherein the coating containing the siloxane polymer further comprises the siloxane polymer dissolved in an organic solvent, the solvent being selected from the group consisting of aromatic hydrocarbons and their epoxy-functional derivatives, glycol ethers, alkanes and their epoxy-functional derivatives, ketones, esters and orthoesters, chlorinated hydrocarbons, chlorofluorocarbons and alcohols.

4. The method of claim 3 wherein the organic solvent is selected from the group consisting of diglyme, methoxypropanol and toluene.

5. The method of claim 4 wherein the organic solvent is diglyme and the solubility of the siloxane polymer in the organic solvent is at least 15% by weight, based on the weight of the solution.

6. The method of claim 1 wherein the coated substrate is heated to a temperature of about 150° C. to about 700° C. to convert the siloxane polymer into a SiO$_2$-containing ceramic film.

7. The method of claim 1 wherein the coated substrate is exposed to ultraviolet irradiation to convert the siloxane polymer into a SiO$_2$-containing ceramic film.

8. The method of claim 1 wherein, in the general formula for the organosilane, R is an ethyl group or propyl group having at least one but not more than two β-substituents selected from the group consisting of chlorine, bromine, fluorine, iodine, methoxy and ethoxy.

9. The method of claim 1 wherein the siloxane polymer further comprises at least one but not more than two α-substituents on the β-substituted alkyl group, the α-substituent being selected from the group consisting of chlorine, bromine, fluorine, iodine, methoxy and ethoxy.

10. The method of claim 9 wherein the α-substituent is the same as the β-substituent on the alkyl group of the siloxane polymer.

11. The method of claim 1 wherein, in the general formula for the organosilane, n is 1; X is a halogen selected from the group consisting of chlorine and bromine or an alkoxy selected from the group consisting of methoxy and ethoxy substituents; and R is an ethyl group having at least one but not more than two β-substituents selected from the group consisting of chlorine, bromine and fluorine and methoxy.

12. The method of claim 11 wherein the siloxane polymer further comprises at least one but not more than two α-substituents on the β-substituted ethyl group, the α-substituent being selected from the group consisting of chlorine, bromine, fluorine and methoxy.

13. The method of claim of claim 12 wherein the α-substituent is the same as the β-substituent on the ethyl group.

14. The method of claim 1 wherein the polymeric reaction product is obtained from the hydrolysis and condensation polymerization of β-chloroethyltrichlorosilane.

15. The method of claim 1 wherein the polymeric reaction product contains about 20 to about 50 silanol groups per 100 silicon atoms.

16. The method of claim 1 wherein the polymeric reaction product is obtained from homopolymerization of the organosilane.

17. The method of claim 1 wherein the polymeric reaction product is obtained from copolymerization of the organosilane with an alkoxysilane.

18. The method of claim 17 wherein the alkoxysilane is selected from the group consisting of tetraethoxysilane, tetramethoxysilane, methoxytriethoxysilane, triethoxychlorosilane, bis(β-chloroethyl)dichlorosilane, bis (trimethoxysilyl)-ethane, methyltriethoxysilane, vinyltriethoxysilane, pentafluorophenyltriethoxysilane and tridecafluorooctyl-1H,2H,2H-octyltriethoxysilane.

19. The method of claim 1 wherein the siloxane polymer further comprises a polymeric reaction product obtained from copolymerization of the organosilane with a hydride-functional silane selected from the group consisting of trichlorosilane and triethoxysilane.

20. The method of claim 1 wherein the siloxane polymer further comprises a polymeric reaction product obtained from copolymerization of the organosilane with an organotrichlorosilane selected from the group consisting of ethyltrichlorosilane, methyltrichlorosilane and phenyltrichlorosilane.

* * * * *